(12) United States Patent
Otani et al.

(10) Patent No.: US 11,417,693 B2
(45) Date of Patent: Aug. 16, 2022

(54) MODULE, METHOD FOR MANUFACTURING MODULE, AND ELECTRONIC DEVICE

(71) Applicant: SONY CORPORATION, Tokyo (JP)

(72) Inventors: Hidetsugu Otani, Kumamoto (JP); Yuuji Kishigami, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 312 days.

(21) Appl. No.: 15/580,344

(22) PCT Filed: May 25, 2016

(86) PCT No.: PCT/JP2016/065514
§ 371 (c)(1),
(2) Date: Dec. 7, 2017

(87) PCT Pub. No.: WO2016/203923
PCT Pub. Date: Dec. 22, 2016

(65) Prior Publication Data
US 2020/0043965 A1    Feb. 6, 2020

(30) Foreign Application Priority Data

Jun. 18, 2015  (JP) .............................. JP2015-123176

(51) Int. Cl.
*H01L 27/146*    (2006.01)
*H04N 5/225*    (2006.01)
(Continued)

(52) U.S. Cl.
CPC ........ *H01L 27/14618* (2013.01); *H01L 24/48* (2013.01); *H01L 24/85* (2013.01);
(Continued)

(58) Field of Classification Search
CPC ................. H01L 31/0203; H01L 24/85; H01L 27/14618; H01L 31/024; H01L 27/14625;
(Continued)

(56) References Cited

U.S. PATENT DOCUMENTS

2005/0170561 A1    8/2005    Huang et al.
2013/0286592 A1    10/2013    Tsuduki et al.
(Continued)

FOREIGN PATENT DOCUMENTS

CN    103378013 A    10/2013
CN    103943613 A    7/2014
(Continued)

OTHER PUBLICATIONS

International Search Report and Written Opinion of PCT Application No. PCT/JP2016/065514, dated Jul. 5, 2016, 11 pages of ISRWO.

*Primary Examiner* — Julia Slutsker
(74) *Attorney, Agent, or Firm* — Chip Law Group

(57) ABSTRACT

Provided is a module including an organic substrate, an image sensor mounted on an upper surface of the organic substrate, a wire connecting the image sensor and the organic substrate, and a wire sealing unit adhered to a side surface of the image sensor while encompassing the wire. A thermal conductivity of the wire sealing unit is higher than a thermal conductivity of the organic substrate.

6 Claims, 3 Drawing Sheets

(51) Int. Cl.
*H01L 23/00* (2006.01)
*H01L 31/0203* (2014.01)
*H01L 31/0232* (2014.01)
*H01L 31/024* (2014.01)
*H04N 5/369* (2011.01)

(52) U.S. Cl.
CPC .. *H01L 27/14625* (2013.01); *H01L 27/14636* (2013.01); *H01L 27/14683* (2013.01); *H01L 31/0203* (2013.01); *H01L 31/024* (2013.01); *H01L 31/02325* (2013.01); *H04N 5/2253* (2013.01); *H04N 5/22521* (2018.08); *H04N 5/369* (2013.01); *H01L 2224/48091* (2013.01); *H01L 2224/48106* (2013.01); *H01L 2224/48225* (2013.01)

(58) Field of Classification Search
CPC .. H01L 27/14636; H01L 24/48; H04N 5/2253
See application file for complete search history.

(56) References Cited

U.S. PATENT DOCUMENTS

| | | | |
|---|---|---|---|
| 2014/0197506 A1 | 7/2014 | Watanabe | |
| 2014/0350146 A1* | 11/2014 | Tsubouchi | G02B 5/208 524/94 |
| 2014/0368723 A1* | 12/2014 | Jung | H04N 5/2257 348/340 |
| 2015/0171128 A1* | 6/2015 | Ogata | H01L 27/14683 250/208.1 |
| 2015/0295140 A1* | 10/2015 | Aoyagi | H01L 31/0203 257/99 |
| 2015/0380452 A1 | 12/2015 | Watanabe | |
| 2016/0072028 A1* | 3/2016 | Naka | H01L 33/486 257/99 |
| 2018/0226552 A1* | 8/2018 | Lee | H01L 33/56 |

FOREIGN PATENT DOCUMENTS

| | | | |
|---|---|---|---|
| CN | 104716149 A | 6/2015 | |
| EP | 2657964 A2 | 10/2013 | |
| JP | 06-021414 A | 1/1994 | |
| JP | 2007-158779 A | 6/2007 | |
| JP | 2009-188191 A | 8/2009 | |
| JP | 2010-212481 A | 9/2010 | |
| JP | 2012-124305 A | 6/2012 | |
| JP | 2013-243341 A | 5/2013 | |
| JP | 2013-243341 A | 12/2013 | |
| JP | 2014-138119 A | 7/2014 | |
| JP | 2015-115522 A | 6/2015 | |
| RU | 2013116880 A | 10/2014 | |
| TW | 200527689 A | 8/2005 | |
| WO | WO 2014069362 * | 5/2014 | G09F 9/30 |

* cited by examiner

MODULE, METHOD FOR MANUFACTURING MODULE, AND ELECTRONIC DEVICE

CROSS REFERENCE TO RELATED APPLICATIONS

This application is a U.S. National Phase of International Patent Application No. PCT/JP2016/065514 filed on May 25, 2016, which claims priority benefit of Japanese Patent Application No. JP 2015-123176 filed in the Japan Patent Office on Jun. 18, 2015. Each of the above-referenced applications is hereby incorporated herein by reference in its entirety.

TECHNICAL FIELD

The present technology relates to a module, a method for manufacturing a module, and an electronic device.

BACKGROUND ART

Patent Literature 1 discloses a solid-state imaging device in which a solid-state imaging element is installed on a concavity of a base, a frame unit is fixed around the concavity of the base, a lid is attached on the frame unit, a space is formed between the lid, the frame unit, the base, and the imaging element, and a lead provided along a surface of the base and the solid-state imaging element are interconnected by a bonding wire in this space. This solid-state imaging device has a configuration in which a prescribed amount of a sealing agent is applied to the back surface side of the lid, the lid is attached on the frame unit by the sealing agent, and the bonding wire is embedded in the sealing agent and encompassed by the sealing agent in the space mentioned above.

In the solid-state imaging device thus configured, the sealing agent encompasses and protects the bonding wire. Further, if an opaque sealing agent is used, even if a glossy wire such as a metal wire is used, the reflected light from the wire does not enter a pixel of the solid-state imaging element and there is no adverse effect on an image such as a flare, and a solid-state imaging device with high reliability of image quality can be obtained.

CITATION LIST

Patent Literature

Patent Literature 1: JP H6-21414A

DISCLOSURE OF INVENTION

Technical Problem

A camera module in which an image sensor is installed and fixed on a substrate is generally equipped with a heat sensor and a protection circuit that protects the module from heat. If the heat sensor senses a certain temperature or more, the protection circuit shuts down the module.

Here, a test performed by the inventors of the present application has revealed that a temperature rise curve of a camera module is a curve in an exponential manner in which the slope decreases gradually, and a temperature decrease of 2° C. as a whole causes the time until the module reaches a certain temperature at which the module shuts down (for example, 60° C.) to be delayed by 3 to 4 minutes.

The present technology has been made in view of the above problem, and an object of the present technology is to suppress the heat rising of a module in which an image sensor is installed and fixed on a substrate more than before, make the time until the temperature of the module reaches a prescribed temperature later than before, and thereby make the available time of the module longer than before.

Solution to Problem

An aspect of the present technology is a module including: an organic substrate; an image sensor mounted on an upper surface of the organic substrate; a wire connecting the image sensor and the organic substrate; and a wire sealing unit adhered to a side surface of the image sensor while encompassing the wire. A thermal conductivity of the wire sealing unit is higher than a thermal conductivity of the organic substrate.

Further, another aspect of the present technology is a method for manufacturing a module, including: a step of mounting a component on a substrate; a step of forming a frame unit made of a resin on the organic substrate by mold forming so as to encompass the component; a step of fragmenting the organic substrate; a step of installing an image sensor in a position that is on the fragmented organic substrate and is surrounded by the frame unit; a step of connecting the organic substrate and the image sensor using a wire; and a step of forming a wire sealing unit made of a resin and adhered to a side surface of the image sensor while encompassing the wire.

Further, another aspect of the present technology is a method for manufacturing a module, including: a step of mounting a component on a substrate; a step of installing an image sensor on the substrate; a step of connecting the organic substrate and the image sensor using a wire; a step of forming a frame unit made of a resin around the image sensor on the organic substrate by mold forming so as to encompass the component and the wire; and a step of fragmenting the organic substrate.

Further, another aspect of the present technology is an electronic device including: a module including a substrate, an image sensor mounted on an upper surface of the organic substrate, a wire connecting the image sensor and the organic substrate, and a wire sealing unit adhered to a side surface of the image sensor while encompassing the wire. A thermal conductivity of the wire sealing unit is higher than a thermal conductivity of the organic substrate.

In addition, the module and the electronic device described above include various aspects such as being implemented in a state of being incorporated in another apparatus and being implemented together with another method. Further, the method for manufacturing a module described above may be implemented as part of another method, or may be performed as a manufacturing apparatus that executes the processes of manufacturing apparatuses each including a means corresponding to each process, a control program that controls the manufacturing apparatus, a computer-readable recording medium on which the control program is recorded, etc.

Advantageous Effects of Invention

According to the present technology, the heat rising of a module in which an image sensor is installed and fixed on a substrate can be suppressed more than before, the time until the temperature of the module reaches a prescribed temperature can be made later than before, and thereby the available time of the module can be made longer than before. In addition, the effects described in the present specification are only examples and are not limitative ones, and there may be further additive effects.

MODE(S) FOR CARRYING OUT THE INVENTION

Figure 1:
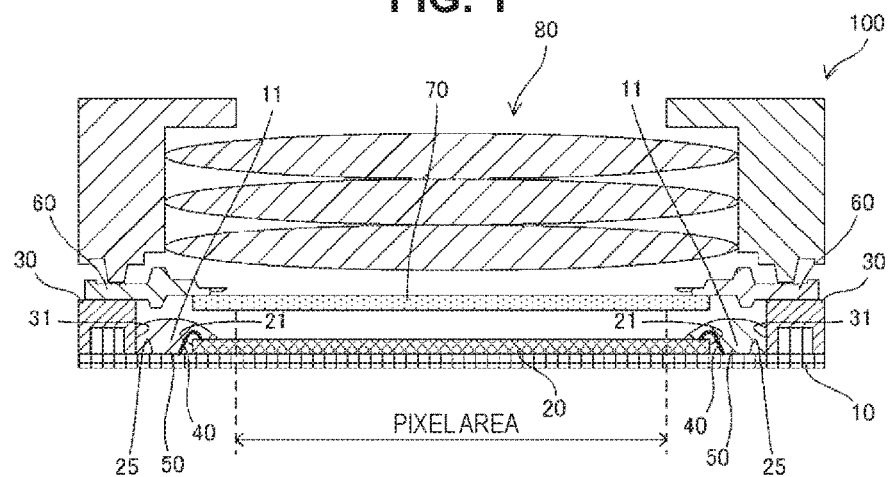
FIG. 1 is a diagram describing the configuration of a module according to a first embodiment.

Hereinbelow, the present technology is described in the following order.
(A) First embodiment
(B) Second embodiment
(C) Third embodiment
(D) Fourth embodiment
(E) Fifth embodiment (A) FIRST EMBODIMENT FIG. 1 is a diagram schematically showing the configuration of a module 100 according to the present embodiment. The module 100 includes an organic substrate 10, an imaging element 20, a frame unit 30 made of a resin, wires 40 as metal wires connecting the imaging element 20 and the organic substrate 10 together, and a sealing unit 50 sealing the wire 40. One end of the wire 40 is connected to a part of the organic substrate 10 not facing the frame unit 30 or the imaging element 20, and the other end of the wire 40 is connected to an edge portion of the upper surface of the imaging element 20.

As the organic substrate 10, various substrates with a flat upper surface may be used; for example, a flexible substrate using a thin, flexible organic material as an insulating matrix, a rigid substrate using a nonflexible organic material as an insulating matrix, a rigid-flexible substrate in which a flexible substrate and a rigid substrate are combined, etc. may be used. That is, the organic substrate 10 according to the present embodiment may be not only a substrate formed of only an organic substance such as a resin but also "a substrate containing an organic substance" in which an organic substance such as a resin contains another material such as a metal.

The thermal conductivity of the organic substrate 10 is 0.2 to 0.3 W/m·K, which is lower than the thermal conductivity of a resin used for molding or sealing.

The imaging element 20 is mounted and fixed in a prescribed position of the upper surface of the organic substrate 10. A plurality of pixels that receive light incident from a subject via an optical system are formed on the upper surface of the imaging element 20, and the imaging element 20 photoelectrically converts light received by the pixel and outputs an electrical signal in accordance with the amount of light.

Figure 2:
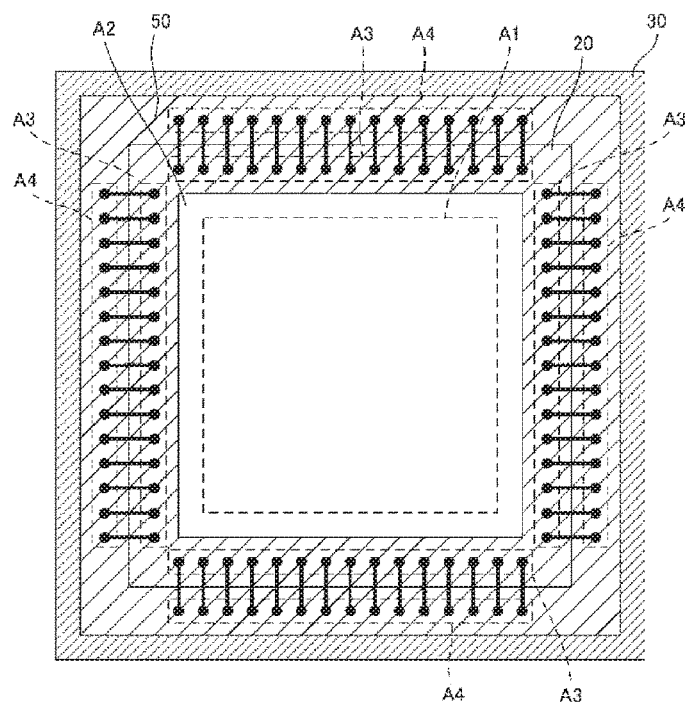
FIG. 2 is a diagram describing the upper surface configuration of a module according to the first embodiment.

FIG. 2 is a diagram schematically showing an example of the layout of the upper surface of the module 100. The upper surface of the imaging element 20 has a light receiving area A1 where a plurality of pixels are formed and a non-light receiving area A2 where a pixel is not formed.

A plurality of pixels are two-dimensionally arrayed in the light receiving area A1, for example. The two-dimensional array includes various arrays, such as a diagonal array, a delta array, and a honeycomb array.

The non-light receiving area A2 is an area including, for example, a peripheral circuit area where a peripheral circuit is formed and an external connection area A3 described later. In addition, in a case where a stack-type image sensor in which a pixel and a peripheral circuit are juxtaposed in the thickness direction of the imaging element 20 is used as the imaging element 20, a peripheral circuit area is formed on the back surface side of the light receiving area A1 (the organic substrate 10 side of the imaging element 20); therefore, in this case there is a case where the non-light receiving area A2 does not include a peripheral circuit area.

In the non-light receiving area A2, an external connection area A3 where electrodes for external connection are provided is provided in an edge portion of the upper surface along a side of the imaging element 20, and electrodes for external connection are provided along at least one of the four sides of the imaging element 20.

The frame unit 30 is formed by mold forming of a resin in a shape surrounding the imaging element 20 on the upper surface of the organic substrate 10. The frame unit 30 may be formed to encompass at least part of a circuit element mounted on the organic substrate 10.

The frame unit 30 is configured with a resin with a higher thermal conductivity than the organic substrate 10, and is specifically configured with a resin with a thermal conductivity of 0.5 W/m·K or more. As the resin of the frame unit 30, at least one of an epoxy resin, an acrylic resin, and a vinyl resin may be used. By forming the frame unit 30 with a resin with a higher thermal conductivity than the organic substrate 10, the heat generated in the imaging element 20 is easily dissipated as the entire module 100.

In the present embodiment, a certain gap 25 is provided between the imaging element 20 and the frame unit 30, and in the gap 25, the upper surface of the organic substrate 10 forms an open portion 11 not covered by the frame unit 30 or the imaging element 20.

In the open portion 11 of the organic substrate 10, an element connection area A4 where electrode pads connected to electrodes formed in the external connection area A3 of the imaging element 20 are provided is provided around the fixing position of the imaging element 20. Electrode pads of the element connection area A4 are juxtaposed to the open portion 11 of the organic substrate 10 along a side of the imaging element 20, and are provided along at least one of the four sides of the imaging element 20.

The wire 40 mutually connects each electrode of the external connection area A3 of the imaging element 20 and each electrode of the element connection area A4 of the organic substrate 10. The imaging element 20 outputs, via the wire 40, an electrical signal generated by photoelectric conversion to a processing circuit on a later stage provided on the organic substrate 10 or the like.

The wire 40 connects an edge portion of the upper surface of the imaging element 20 and the open portion 11 of the organic substrate 10 facing the edge portion together in an arc-like bent shape, and the highest point of the bent portion is at a height of approximately several ten to several hundred micrometers from the upper surface of the imaging element 20. In addition, the connections by the wires 40 between the imaging element 20 and the organic substrate 10 may be provided along at least one side of the imaging element 20, and the number of connections is altered to increase or decrease in accordance with the necessity of signal outputs from the imaging element 20 to the organic substrate 10, as appropriate.

The wire 40 is sealed by an opaque resin (hereinafter, written as the sealing unit 50). In order to encompass the wire 40, the sealing unit 50 is put in the gap 25 described above so as to surround the entire periphery of the imaging element 20, and adheres firmly to the open portion 11 of the organic substrate 10.

A part of the sealing unit 50 is provided to extend protrusively to the upper surface of an edge portion of the imaging element 20; and the sealing unit 50 covers at least the external connection area A3 of the organic substrate 10, covers the element connection area A4 of the upper surface of an edge portion of the imaging element 20, and encompasses the wire 40. The inner end of the sealing unit 50 is located on the inside of the outer end of the imaging element 20, and is located in the non-light receiving area A2 of the imaging element 20. The outer end of the sealing unit 50 is located on the outside of the outer end of the imaging element 20, and substantially coincides with the inner end of the frame unit 30. The upper end of the sealing unit 50 is located above the upper surface of the imaging element 20 and above the uppermost portion of the wire 40.

The sealing unit 50 adheres to and is integrated with the organic substrate 10 facing the gap 25, a wall surface 31 of the frame unit 30, and a wall surface 21 of the imaging element 20. By the sealing unit 50 integrating the imaging element 20 and the organic substrate 10 with the frame unit 30, the imaging element 20 and the organic substrate 10 can be reinforced. Hence, it is easy to employ a low rigid imaging element 20 and a low rigid organic substrate 10 (a flexible substrate as the organic substrate 10, and a wafer level chip size package (WLCSP) or the like as the imaging element 20).

The sealing unit 50 is configured with a resin with a higher thermal conductivity than the organic substrate 10, and is specifically configured with a resin with a thermal conductivity of 0.5 W/m·K or more. Examples include an epoxy resin, an acrylic resin, a vinyl resin, a mixed resin of an acrylic and an epoxy, and the like. The resin of the frame unit 30 and the resin of the sealing unit 50 may be the same kind of resin, or may be different kinds of resin. By using a resin with a higher thermal conductivity than the organic substrate 10 as the sealing unit 50, the heat generated from the imaging element 20 is easily dissipated.

A frame 60 is mounted and fixed on the frame unit 30. The frame 60 is a frame-like member having a rectangular opening of substantially the same shape as the light receiving area A1 of the imaging element 20. The light receiving area A1 of the imaging element 20 and the rectangular opening of the frame 60 are arranged in a positional relationship of being offset along the optical axis direction of light incident on the light receiving area A1 of the imaging element 20.

A functional optical filter 70 such as an infrared cut filter is fixed to the rectangular opening of the frame 60. In addition, although FIG. 1 shows an example in which the functional optical filter 70 is fixed to a side surface facing the imaging element 20 in the rectangular opening of the frame 60, the functional optical filter 70 may be fixed to a side surface facing a lens unit 80 in the rectangular opening of the frame 60.

A lens unit 80 is mounted and fixed on the frame 60. The lens unit 80 has a configuration in which one or a plurality of lenses are provided in a case and a driving motor such as a voice coil motor provided on the side surface of the lens drives the lens. The lower end of the case is fixed to the frame unit 30 via the frame 60.

A driving driver (not illustrated) for driving the driving motor of the lens unit 80 is mounted on the organic substrate 10, for example. In a case where a driving driver is mounted on the organic substrate 10, also circuit components of the driving driver may be buried in the frame unit 30.

As described hereinabove, the module 100 according to the present embodiment includes the organic substrate 10 with a flat upper surface, the imaging element 20 mounted on the upper surface of the organic substrate 10, the frame unit 30 provided on the organic substrate 10 so as to surround the periphery of the imaging element 20, the wire 40 connecting an edge portion of the imaging element 20 and the organic substrate 10, and the sealing unit 50 provided so as to encompass the wire 40 and cover the connection part of the wire 40 of an edge portion of the imaging element 20 and the connection part of the wire 40 of the organic substrate 10, and has a configuration in which the thermal conductivity of the sealing unit 50 is larger than the thermal conductivity of the organic substrate 10. Thus, heat dissipation efficiency is markedly improved over a conventional module including an imaging element.

Figure 3:
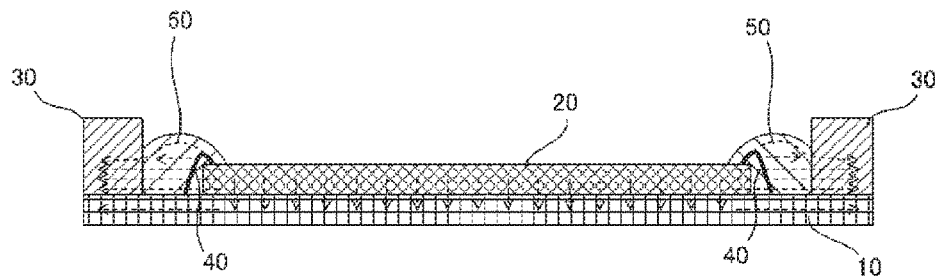
FIG. 3 is a diagram describing a heat dissipation path of an imaging element.

FIG. 3 a diagram describing a thermal path of the module 100. The drawing shows a thermal path with a broken line arrow, and shows an overview of the magnitude relationship of thermal conductivity using the density of broken line arrows.

As shown in the drawing, the heat dissipation from the imaging element 20 according to the present embodiment mainly includes heat dissipation to the lens unit via an air layer provided along the upper surface of the imaging element 20, heat dissipation via the organic substrate 10 provided on the lower surface of the imaging element 20, and heat dissipation from the side surface and an edge portion of the upper surface of the imaging element 20 via the sealing unit 50 and the frame unit 30.

Here, the thermal conductivity of the sealing unit 50 and the frame unit 30 is higher than the thermal conductivity of the air layer provided along the upper surface of the imaging element 20, and is higher also than the thermal conductivity of the organic substrate 10 placed in a positional relationship of covering the lower surface of the imaging element 20. That is, the sealing unit 50 and the frame unit 30 made of a resin with a high thermal conductivity are provided so as to thread their way through a gap between members that are hard to improve in heat dissipation performance easily, such as the air layer provided along the upper surface of the imaging element 20 and the organic substrate 10, and heat is allowed to dissipate easily from the side surface of the imaging element 20 to the outside of the module 100. Thereby, while alteration from a conventional configuration is kept to the necessary minimum, heat dissipation efficiency is markedly improved over a conventional module, and the time until the temperature of the module 100 reaches a prescribed temperature is made later than before; thus, the available time of the module can be made longer than before.

(B) SECOND EMBODIMENT

FIG. 4 is a diagram describing a method for manufacturing the module 100 described above. Here, the drawing shows the manufacturing process before the frame 60, the functional optical filter 70, and the lens unit 80 are installed.

Figure 4A:
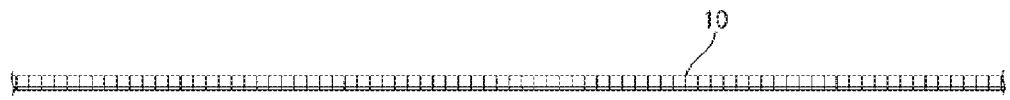
FIGS. 4(a), 4(b), 4(c), 4(d), 4(e), 4(f), and 4(g) are diagrams describing a method for manufacturing a module according to the first embodiment.

First, the organic substrate 10 with a flat upper surface before fragmentation is prepared (FIG. 4(a)).

Figure 4B:

Next, necessary surface-mount components are arranged and mounted on the organic substrate 10 (FIG. 4(b)). The surface-mount components are mounted in an area where the frame unit 30 is to be formed by mold forming performed later.

Figure 4C:
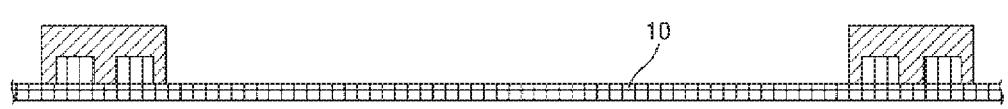

Next, a mold such as a metal mold is set on the organic substrate 10, and a mold resin that forms the frame unit 30 by cutting in a later process is formed on the organic substrate 10 by mold forming in which a liquid resin is poured into the mold and is hardened (FIG. 4(c)). The resin used as the mold resin is an opaque resin, and is one or a plurality of resins selected from an epoxy resin, an acrylic resin, and a vinyl resin. These resins have a thermal conductivity of 0.5 W/m·K or more. The mold resin is formed so as to surround the installation area of the imaging element 20 that is to be installed on the organic substrate 10 later.

Figure 4D:
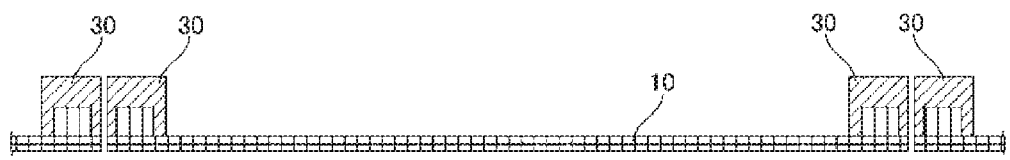

Next, the organic substrate 10 on which the mold resin is formed is fragmented (FIG. 4(d)). The organic substrate 10 and the mold resin are cut at substantially the center in the width direction of the mold resin and along the extending direction of the mold resin. Thereby, the frame unit 30 is formed on the fragmented organic substrate 10, and the cut surface of the frame unit 30 is exposed on the side surface of the module 100. After the fragmentation, the area surrounded by the frame unit 30 of the organic substrate 10, the cut surface of the frame unit 30, etc. are cleaned. By the cleaning, dirt adhered to the organic substrate 10 in a process performed prior to the mold forming, fragmentation, etc., a burr of the mold resin, etc. are removed.

Figure 4E:

Next, die bonding in which the imaging element 20 is installed and adhered in a prescribed position surrounded by the frame unit 30 of the surface of the organic substrate 10 is performed (FIG. 4(e)). The imaging element 20 is fixed on the organic substrate 10, with the light receiving surface set on a side not facing the organic substrate 10.

Figure 4F:
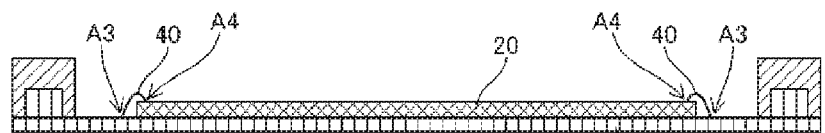

Next, wire bonding in which an electrode pad provided in the element connection area A4 of the organic substrate 10 and an electrode provided in the external connection area A3 of the imaging element 20 are connected by the wire 40 is performed (FIG. 4(f)).

Figure 4G:
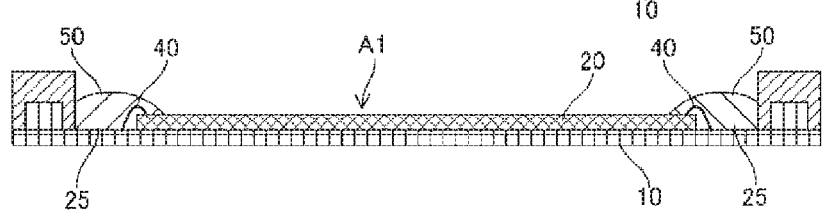

Next, a liquid resin is poured into the gap 25 between the frame unit 30 and the imaging element 20, and treatment such as heating is performed to put and solidify the resin; thereby, the sealing unit 50 is formed (FIG. 4(g)). The resin put and solidified in the gap 25 is applied risingly so as to spread from the gap 25, over the end of the imaging element 20, and to the upper surface of an edge portion of the imaging element 20, and the sealing unit 50 encompasses the entire wire 40. The resin applied risingly on the upper surface of an edge portion of the imaging element 20 is applied in an area not reaching the light receiving area A1 while covering the external connection area A3 of the imaging element 20. In addition, as necessary, the resin may be applied after the light receiving area A1 of the imaging element 20 is masked with a tape or the like so that the resin does not reach the upper side of the light receiving area A1.

The resin used for the formation of the sealing unit 50 is one or a plurality of resins selected from an epoxy resin, an acrylic resin, and a vinyl resin. These resins have a thermal conductivity of 0.5 W/m·K or more. The viscosity of the resin used for the formation of the sealing unit 50 is set such that the resin is put in without a gap up to the corner between the organic substrate 10 and the imaging element 20 and the corner between the organic substrate 10 and the frame unit 30. Thereby, the rate of filling of the resin in the gap 25 can be improved.

After that, the frame 60 is mounted on the frame unit 30 and is fixed by an adhesive or the like. The functional optical filter 70 such as an infrared cut filter is fixed in the rectangular opening of the frame 60. The lens unit 80 is mounted and fixed on the frame 60 using an adhesive or the like. By the above process, the module 100 according to the first embodiment can be manufactured.

(C) THIRD EMBODIMENT

Figure 5:
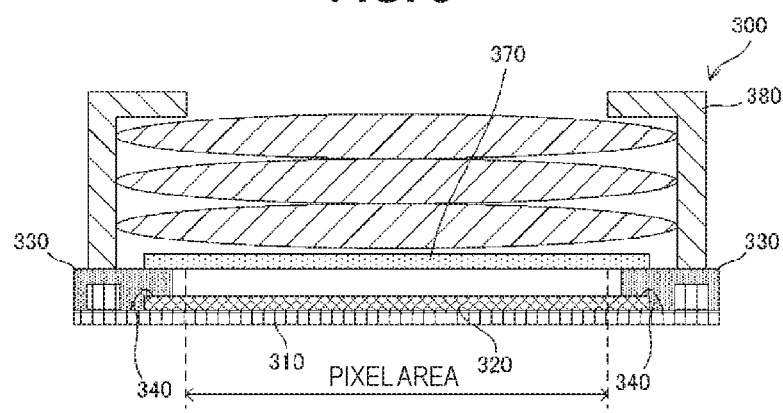
FIG. 5 is a diagram describing the configuration of a module according to a third embodiment.

FIG. 5 is a diagram schematically showing the configuration of a module 300 according to the present embodiment. The module 300 includes an organic substrate 310, an imaging element 320, wires 340 as metal wires connecting the imaging element 320 and the organic substrate 310 together, and a frame unit 330 made of a resin and sealing the wire 340. One end of the wire 340 is connected to the organic substrate 310, and the other end of the wire 340 is connected to an edge portion of the upper surface of the imaging element 320.

Here, the module 300 has a configuration substantially identical to the module 100 according to the first embodiment except for the frame unit 330, and therefore a detailed description of the configuration other than the frame unit 330 is omitted in the following.

As the organic substrate 310, various substrates with a flat upper surface may be used; for example, a flexible substrate using a thin, flexible organic material as an insulating matrix, a rigid substrate using a nonflexible organic material as an insulating matrix, a rigid-flexible substrate in which a flexible substrate and a rigid substrate are combined, etc. may be used. That is, the organic substrate 10 according to the present embodiment may be not only a substrate formed of only an organic substance such as a resin but also "a substrate containing an organic substance" in which an organic substance such as a resin contains another material such as a metal.

The thermal conductivity of the organic substrate 310 is 0.2 to 0.3 W/m·K, which is lower than the thermal conductivity of a resin used for molding.

The imaging element 320 is mounted and fixed in a prescribed position of the upper surface of the organic substrate 310. The upper surface configuration of the imaging element 320 is similar to that of the imaging element 20 according to the first embodiment described above, and has the light receiving area A1 (not illustrated in FIG. 5) where a plurality of pixels are formed and the non-light receiving area A2 (not illustrated in FIG. 5) where a pixel is not formed.

On the organic substrate 310, the element connection area A4 (not illustrated in FIG. 5) where electrode pads connected to electrodes formed in the external connection area A3 (not illustrated in FIG. 5) of the imaging element 320 are provided is provided around the fixing position of the imaging element 320. Electrode pads of the element connection area A4 are juxtaposed to the organic substrate 310 along a side of the imaging element 320, and are provided along at least one of the four sides of the imaging element 320.

Like in the imaging element 20 according to the first embodiment described above, the wire 340 mutually connects each electrode of the external connection area A3 of the imaging element 320 and each electrode of the element connection area A4 of the organic substrate 310.

In order to encompass the wire 340 on the upper surface of the organic substrate 310, the frame unit 330 is formed by resin mold forming so as to surround the entire periphery of the imaging element 320, and a part of the frame unit 330 extends protrusively to the upper surface of an edge portion of the imaging element 320 and covers the wire 340. That is, the frame unit 330 is formed so as to encompass the wire 340 and encompass at least part of a circuit element mounted on the organic substrate 310, and has functions of both the frame unit 30 and the sealing unit 50 according to the first embodiment.

The frame unit 330 is configured with a resin with a higher thermal conductivity than the organic substrate 310, and is specifically configured with a resin with a thermal conductivity of 0.5 W/m·K or more. The resin of the frame unit 330 is at least one of an epoxy resin, an acrylic resin, and a vinyl resin. By using a resin with a higher thermal conductivity than the organic substrate 310 as the frame unit 330, the heat generated in the imaging element 320 is dissipated easily.

A part of the frame unit 330 extends protrusively to the upper surface of an edge portion of the imaging element 320, and covers the wire 340. The inner end of the frame unit 330 is located on the inside of the outer end of the imaging element 320, and is located in the non-light receiving area A2 of the imaging element 320. The outer end of the frame unit 330 is located on the outside of the outer end of the imaging element 320, and the outside surface of the frame unit 330 constitutes a part of the outside surface of the module 300.

The upper end of the frame unit 330 is located above the upper surface of the imaging element 320 and above the uppermost portion of the wire 340.

Thus, the imaging element 320 can be downsized by providing the frame unit 330 having functions of both the sealing unit 50 and the frame unit 30 in the first embodiment described above. That is, the distance between the wire 340, which is sealed in the sealing unit 50 in the module 100 according to the first embodiment, and the surface-mount components, which are sealed in the frame unit 30, can be brought close together, and the wire 340 and the surface-mount components can be collectively sealed in the frame unit 330; therefore, the distance from the side surface of the imaging element 320 to the side surface of the module 300 is shortened, and the entire module 300 can be downsized. Then, by the shortening of the distance from the imaging element 320 to the side surface of the module 300, also the heat dissipation path from the imaging element 320 to the outside is shortened, and heat dissipation efficiency is improved.

A functional optical filter 370 such as an infrared cut filter is fixed on the frame unit 330, which is provided to extend to the upper surface of an edge portion of the imaging element 320. That is, since the frame unit 330 is provided to extend up to the vicinity of the light receiving area A1 on the upper surface of an edge portion of the imaging element 320, a functional optical filter 370 of a size substantially equal to the size of a conventional functional optical filter that is fixed to an inner edge portion of the frame 60, which is provided to extend up to the vicinity of the light receiving area A1, can be fixed on the frame unit 330. Hence, the frame 60 according to the first embodiment becomes unnecessary in the present embodiment.

A lens unit 380 has a configuration similar to the lens unit 80 according to the first embodiment described above, but is mounted and fixed directly on the frame unit 330. Hence, the lens unit 380 is placed nearer to the imaging element 320 by an amount equal to the thickness of the frame 60 according to the first embodiment, and a reduction in the height of the entire module 300 etc. can be achieved; thus, the design flexibility in the thickness direction of the module 300 is improved. Further, since the frame unit 330 is provided protrusively on the outer edge of the imaging element 320, the fixing position of the lens unit 380 on the frame unit 330 can be offset toward the center of the module as a whole. That is, a reduction in the width of the case of the lens unit 380 etc. can be achieved; thus, the design flexibility in the transvers direction of the module 300 is improved.

As described hereinabove, the module 300 according to the present embodiment includes the organic substrate 310 with a flat upper surface, the imaging element 320 mounted on the upper surface of the organic substrate 310, the wire 340 connecting an edge portion of the imaging element 320 and the organic substrate 310, and the frame unit 330 provided so as to encompass the wire 340 and cover the connection part of the wire 340 of an edge portion of the imaging element 320 and the connection part of the wire 340 of the organic substrate 310, and has a configuration in which the thermal conductivity of the frame unit 330 is larger than the thermal conductivity of the organic substrate 310. Hence, heat dissipation efficiency is markedly improved over a conventional module including an imaging element. Further, since a structure in which the wire 340 and the surface-mount components on the organic substrate 310 are collectively sealed by the frame unit 330 is employed, a reduction in the spacing between the wire 340 and the surface-mount components, reductions in the size and height of the entire module 300, etc. can be achieved; thus, the permissible range of the module 300 is improved, and the heat dissipation path from the imaging element 320 via the frame unit 330 is shortened and heat dissipation efficiency is improved.

(D) FOURTH EMBODIMENT

FIG. 6 is a diagram describing a method for manufacturing the module 300 described above. Here, the drawing shows the manufacturing process before the functional optical filter 370 and the lens unit 380 are installed.

Figure 6A:
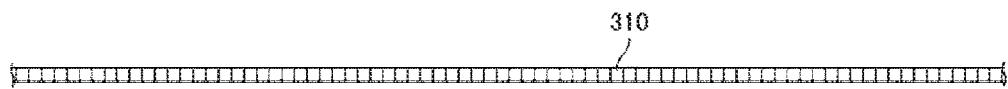
FIGS. 6(a), 6(b), 6(c), 6(d), 6(e), and 6(f) are diagrams describing a method for manufacturing a module according to the third embodiment.

First, the organic substrate 310 with a flat upper surface before fragmentation is prepared (FIG. 6(a)).

Figure 6B:
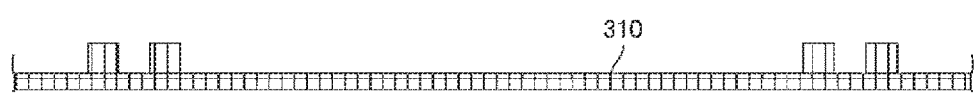
Figure 6C:
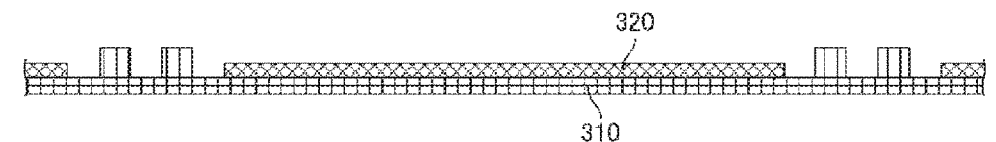

Next, necessary surface-mount components are arranged and fixed on the organic substrate 310 (FIG. 6(b)).

The surface-mount components are fixed in an area where the frame unit 330 is to be formed later by mold forming.

Next, die bonding in which the imaging element 320 is installed and adhered in a prescribed position of the surface of the organic substrate 310 is performed. The imaging element 320 is fixed on the organic substrate 310, with the light receiving surface set to face a side not facing the organic substrate 310 (FIG. 6(c)).

Figure 6D:
Figure 6E:
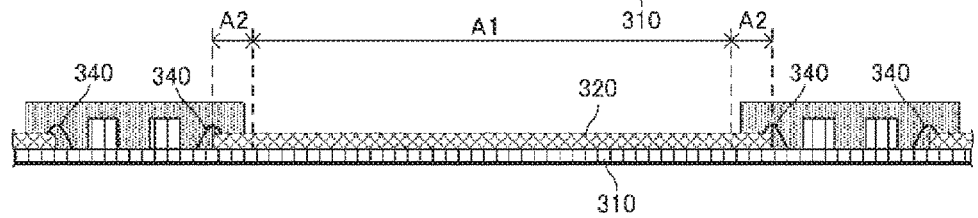
Figure 6F:
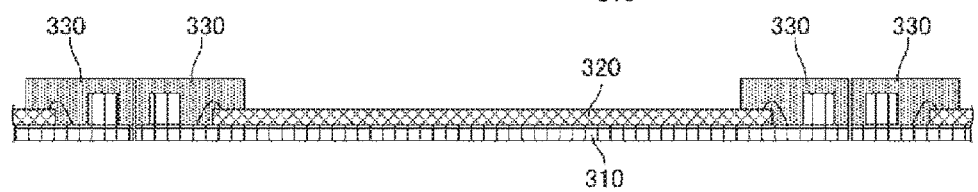

Next, wire bonding in which an electrode pad provided in the element connection area A4 of the organic substrate 310 and an electrode provided in the external connection area A3 of the imaging element 320 are connected by the wire 340 is performed (FIG. 6(d)).

Next, a mold such as a metal mold is set on the organic substrate 310, and a mold resin that forms the frame unit 330 by cutting in a later process is formed on the organic substrate 310 by mold forming in which a liquid resin is poured into the mold and is solidified (FIG. 6(*e*)). The resin used as the mold resin is an opaque resin, and is one or a plurality of resins selected from an epoxy resin, an acrylic resin, and a vinyl resin. These resins have a thermal conductivity of 0.5 W/m·K or more. The mold resin is formed so as to surround the installation area of the imaging element 320, and a part of the mold resin is formed protrusively on the outer edge of the imaging element 320. Specifically, the mold resin is formed in an area not reaching the light receiving area A1 of the imaging element 320 while covering the external connection area A3 of the imaging element 320 and an area on the organic substrate 310 where the surface-mount components are mounted.

In addition, before the setting of the mold, a protection member such as a masking tape is stuck to the light receiving area A1 of the upper surface of the imaging element 320 to protect the light receiving area A1 of the upper surface of the imaging element 320. It is preferable that the protection member be firmly stuck to the upper surface of the imaging element 320 so that the resin for molding does not flow and adhere onto the light receiving area A1 from a gap.

The hollow portion that is formed on the organic substrate 310 when the mold is set is formed in an area including the surface-mount components mounted on the organic substrate 310 and the wire 340. That is, the hollow portion is formed in an area including from the upper side of the organic substrate 310 around the imaging element 320 to the non-light receiving area A2 of the imaging element 320. Thereby, the surface-mount components and the wire 340 are buried by the resin that has flowed and solidified in the hollow portion.

Next, the organic substrate 310 on which the mold resin is formed is fragmented. The organic substrate 310 and the mold resin are cut at substantially the center in the width direction of the mold resin and along the extending direction of the mold resin. Thereby, the cut surface of the frame unit 330 is exposed on the side surface of the module 300. After the fragmentation, the area surrounded by the frame unit 330 of the organic substrate 310, the cut surface of the frame unit 330, etc. are cleaned. By the cleaning, dirt adhered to the organic substrate 310 in a process performed prior to the mold forming, fragmentation, etc., a burr of the mold resin, etc. are removed.

After that, the functional optical filter 370 such as an infrared cut filter is fixed on the frame unit 330. Further, the lens unit 380 is mounted and fixed on the frame unit 330 using an adhesive or the like. By the above process, the module 300 according to the third embodiment can be manufactured.

(E) FIFTH EMBODIMENT

Figure 7:
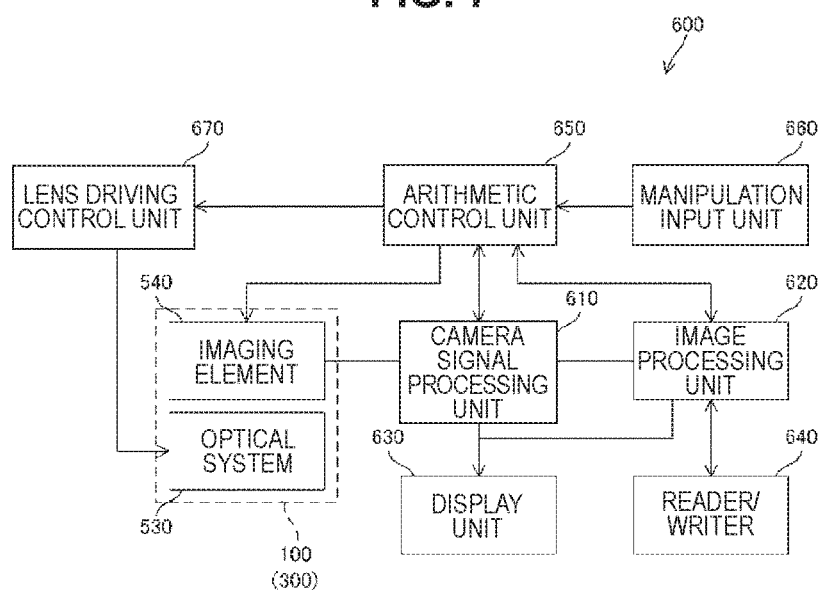
FIG. 7 is a diagram describing the configuration of an imaging device according to a fifth embodiment.

FIG. 7 is a block diagram showing a rough configuration of an example of an electronic device 600 including the module 100 or the module 300 according to the embodiment described above. Examples of the electronic device 600 include imaging devices such as a digital still camera, a digital video camera, and a camera-equipped mobile phone.

The electronic device 600 includes the module 100 or the module 300, a camera signal processing unit 610, an image processing unit 620, a display unit 630, a reader/writer 640, an arithmetic processing unit 650, a manipulation input unit 660, and a lens driving control unit 670.

The module 100 or the module 300 is a constituent element in charge of an imaging function, and includes an optical system 530 including an imaging lens and an imaging element 540 such as a charge-coupled device (CCD) or a complementary metal oxide semiconductor (CMOS). The imaging element 540 converts an optical image formed by the optical system 530 to an electrical signal, and outputs an imaging signal (image signal) in accordance with the optical image.

The camera signal processing unit 610 performs various pieces of signal processing, such as analog/digital conversion, denoising, image quality correction, and conversion to a luminance-color difference signal, on an image signal outputted by the imaging element 540.

The image processing unit 620 is a unit that performs the recording and reproducing processing of an image signal, and performs the processing of compression encoding and expansion decoding of an image signal based on a prescribed image data format, the processing of changing data specifications such as resolution, etc.

The display unit 630 has a function of showing a display in accordance with input manipulation on the manipulation input unit 660 and displaying various data such as a photographed image.

The reader/writer 640 performs data writing on an external storage medium such as a memory card and data reading from an external storage medium; for example, writes image data encoded by the image processing unit 620 on an external storage medium, and reads image data stored in an external storage medium and outputs the image data to the image processing unit 620.

The arithmetic processing unit 650 is a constituent element functioning as a control unit that controls each circuit block of the electronic device 600, and controls each circuit block on the basis of a manipulation input signal from the manipulation input unit 660, etc. A driving driver of the lens driving control unit 670 controls a driving motor that drives the lens of the optical system 530 etc. on the basis of a control signal from the arithmetic processing unit 650.

The manipulation input unit 660 is composed of a switch, a touch panel, etc. for the user's performing necessary manipulation and is configured with, for example, a shutter release manipulation element for performing shutter manipulation, a selection manipulation element for selecting the operating mode, etc.; and outputs a manipulation input signal in accordance with manipulation input performed by the user to the arithmetic processing unit 650.

Note that the present technology is not limited to the embodiments described above, and includes also configurations in which configurations disclosed in the embodiments described above are substituted with each other or combinations are changed, configurations in which known technology and configurations disclosed in the embodiments described above are substituted with each other or combinations are changed, etc. Further, the technical scope of the present technology is not limited to the embodiments described above, and includes also the subject matters described in the claims and the equivalents thereof.

Additionally, the present technology may also be configured as below.

(1)

A module including:

an organic substrate;

an image sensor mounted on an upper surface of the organic substrate;

a wire connecting the image sensor and the organic substrate; and a wire sealing unit adhered to a side surface of the image sensor while encompassing the wire, in which a thermal conductivity of the wire sealing unit is higher than a thermal conductivity of the organic substrate.

(2)

The module according to (1), in which a frame unit made of a resin and formed by mold forming is provided on the organic substrate to surround the image sensor, and the wire sealing unit is a resin put and solidified on the organic substrate between the image sensor and the frame unit.

(3)

The module according to (1), in which a frame unit made of a resin and produced by mold forming on the organic substrate to surround the image sensor constitutes a wire sealing unit adhered to a side surface of the image sensor while encompassing the wire.

(4)

The module according to (2) or (3), in which a lens unit is mounted on the frame unit.

(5)

The module according to any one of (1) to (4), in which the thermal conductivity of the wire sealing unit is 0.5 W/m·K or more, and the thermal conductivity of the organic substrate is 0.2 to 0.3 W/m·K.

(6)

The module according to any one of (1) to (5), in which a resin of the wire sealing unit is at least one of an epoxy resin, an acrylic resin, and a vinyl resin.

(7)

A method for manufacturing a module, including:

a step of mounting a component on a substrate;

a step of forming a frame unit made of a resin on the organic substrate by mold forming so as to encompass the component;

a step of fragmenting the organic substrate;

a step of installing an image sensor in a position that is on the fragmented organic substrate and is surrounded by the frame unit;

a step of connecting the organic substrate and the image sensor using a wire; and a step of forming a wire sealing unit made of a resin and adhered to a side surface of the image sensor while encompassing the wire.

(8)

A method for manufacturing a module, including:

a step of mounting a component on a substrate;

a step of installing an image sensor on the substrate;

a step of connecting the organic substrate and the image sensor using a wire;

a step of forming a frame unit made of a resin around the image sensor on the organic substrate by mold forming so as to encompass the component and the wire; and a step of fragmenting the organic substrate.

(9)

An electronic device including:

a module including a substrate, an image sensor mounted on an upper surface of the organic substrate, a wire connecting the image sensor and the organic substrate, and a wire sealing unit adhered to a side surface of the image sensor while encompassing the wire, in which a thermal conductivity of the wire sealing unit is higher than a thermal conductivity of the organic substrate.

REFERENCE SIGNS LIST 10 organic substrate
11 open portion
20 imaging element
21 wall surface
30 frame unit
31 wall surface
40 wire
50 sealing unit
60 frame
70 functional optical filter
80 lens unit
100 module
300 module
310 organic substrate
311 open portion
320 imaging element
330 frame unit
340 wire
370 functional optical filter
380 lens unit
500 module
511 lens
530 optical system
540 imaging element
600 electronic device
610 camera signal processing unit
620 image processing unit
630 display unit
640 writer
650 arithmetic processing unit
660 manipulation input unit
670 lens driving control unit
A1 light receiving area
A2 non-light receiving area
A3 external connection area
A4 element connection area

The invention claimed is:

1. A module, comprising:

an organic substrate;

an image sensor on a first portion of an upper surface of the organic substrate;

a wire that connects the image sensor and the organic substrate;

a frame unit on and in direct contact with each of a second portion of the upper surface of the organic substrate and a first portion of the image sensor, wherein the frame unit surrounds the first portion of the image sensor, a second portion of the image sensor is outside the frame unit, and the first portion of the upper surface of the organic substrate is different from the second portion of the upper surface of the organic substrate;

an infrared cut filter on the frame unit, wherein the frame unit seals the wire, and a thermal conductivity of the frame unit is higher than a thermal conductivity of the organic substrate; and a lens unit fixed to the frame unit.

2. The module according to claim 1, wherein the frame unit comprises one of an epoxy resin, an acrylic resin, a vinyl resin, or a mixed resin of the epoxy resin and the acrylic resin.

3. The module according to claim 1, wherein
the thermal conductivity of the frame unit is at least 0.5 W/m·K, and
the thermal conductivity of the organic substrate is 0.2 to 0.3 W/m·K.

4. A method for manufacturing a module, the method comprising:
mounting a drive circuit component on an organic substrate;
installing an image sensor on the organic substrate;
connecting the organic substrate and the image sensor with a wire;
forming a frame unit of one of an epoxy resin, an acrylic resin, or a vinyl resin, wherein
the frame unit is formed on the organic substrate by mold forming,
the frame unit encompasses both the drive circuit component and the wire,
the frame unit surrounds a first portion of the image sensor and extends protrusively to an upper surface of an edge portion of the image sensor,
the edge portion of the image sensor corresponds to the first portion of the image sensor,
a second portion of the image sensor is outside the frame unit, and
a thermal conductivity of the frame unit is higher than a thermal conductivity of the organic substrate;
mounting a frame on the frame unit, wherein an infrared cut filter is fixed to the frame unit; and
fixing a lens unit to the frame unit via the frame.

5. A method for manufacturing a module, the method comprising:
mounting a component on an organic substrate;
installing an image sensor on a first portion of the organic substrate;
connecting the organic substrate and the image sensor using a wire;
forming a frame unit, wherein
the frame unit is formed on and in direct with a first portion of the image sensor,
the frame unit surrounds the first portion of the image sensor,
a second portion of the image sensor is outside the frame unit,
the frame unit is formed on and in direct with a second portion of the organic substrate different from the first portion,
the frame unit is formed by mold forming,
the frame unit encompasses each of the component and the wire,
the frame unit comprises one of an epoxy resin, an acrylic resin, a vinyl resin, or a mixed resin of the epoxy resin and the acrylic resin, and
an infrared cut filter is fixed on the frame unit;
fixing a lens unit to the frame unit; and
fragmenting the organic substrate, wherein a thermal conductivity of the frame unit is higher than a thermal conductivity of the organic substrate.

6. An electronic device, comprising:
a module that includes:
an organic substrate;
an image sensor on a first portion of an upper surface of the organic substrate;
a wire that connects the image sensor and the organic substrate;
a frame unit on and in direct contact with each of a second portion of the upper surface of the organic substrate and a first portion of the image sensor, wherein
the frame unit surrounds the first portion of the image sensor,
a second portion of the image sensor is outside of the frame unit, and
the first portion of the upper surface of the organic substrate is different from the second portion of the upper surface of the organic substrate;
an infrared cut filter is on the frame unit;
the frame unit comprises one of an epoxy resin, an acrylic resin, a vinyl resin, or a mixed resin of the epoxy resin and the acrylic resin,
the frame unit seals the wire, and
a thermal conductivity of the frame unit is higher than a thermal conductivity of the organic substrate; and
a lens unit fixed to the frame unit.

* * * * *